United States Patent [19]

Coppens et al.

[11] Patent Number: 4,845,010
[45] Date of Patent: Jul. 4, 1989

[54] SILVER COMPLEX DIFFUSION TRANSFER PROCESSING

[75] Inventors: Paul J. Coppens, Turnhout; Marcel Stroobants, Boortmeerbeek; Herman L. Matthé, Zoersel, all of Belgium

[73] Assignee: Agfa-Gevaert, N.V., Mortsel, Belgium

[21] Appl. No.: 204,232

[22] Filed: Jun. 9, 1988

[30] Foreign Application Priority Data

Jul. 6, 1987 [EP] European Pat. Off. ......... 87201279.4

[51] Int. Cl.$^4$ .............................................. G03C 5/54
[52] U.S. Cl. .................................. 430/204; 430/230; 430/244; 430/606
[58] Field of Search ................. 430/204, 244, 230, 606

[56] References Cited

U.S. PATENT DOCUMENTS

| | | | |
|---|---|---|---|
| 4,326,021 | 4/1982 | Steiger et al. | 430/606 |
| 4,425,420 | 1/1984 | De Jaeger et al. | 430/204 |
| 4,472,497 | 9/1984 | Kitchen | 430/606 |
| 4,666,827 | 5/1987 | Sami et al. | 430/606 |
| 4,686,170 | 8/1987 | Vermeulen et al. | 430/204 |

OTHER PUBLICATIONS

Poot et al., "A Camera Speed Diffusion Transfer...", J. Appl. Photo. Engr., Vol. 5, No. 3, 1979, pp. 169–171.

Primary Examiner—Richard L. Schilling
Attorney, Agent, or Firm—A. W. Breiner

[57] ABSTRACT

A method for the production of a photographic image by silver complex diffusion transfer processing wherein a negative working silver halide emulsion material having particularly high exposure latitude and being manipulatable under room light conditions without prohibitive fogging is used, said material having a low intensity reciprocity failure (L.I.R.F). The material is contact-exposed with visible light through a sheet support carrying paper paste-up material with its information facing the silver halide emulsion layer of the photographic material, and the resulting latent image is developed in the presence of a silver halide complexing agent and the thus developed silver halide emulsion material is contacted with an image-receiving material to form according to a preferred embodiment a planographic printing plate.

10 Claims, 4 Drawing Sheets

SILVER COMPLEX DIFFUSION TRANSFER PROCESSING

DESCRIPTION invention relates to a photographic silver complex diffusion transfer reversal process being particularly suited for the production of a lithographic printing plate.

In the production of lithographic plates, also called planographic plates for use in offset printing, commonly presensitized metal plates are used, i.e. metal plates covered with a photosensitive layer of which the solubility in a wash-off solvent can be changed by photoexposure, leaving after wash-off processing a resist of ink-receptive material on a hydrophilic base. Typical examples of such plates are the diazoplates described in Neblette's Handbook of Photography and Reprography—Materials, Processes and Systems, 7th ed. Edited by John M. Sturge —Van Nostrand Reinhold Company—New York (1977), pp. 492–493.

Presensitized plates have the advantage that can be handled under ambient room light because they are inherently only sensitive to ultraviolet radiation. However, they have the disadvantage that whereas the original to be printed is normally the result of lay-out operating with a paper paste-up procedure, wherein phototype-setting material and screen image material are combined, the exposure in a contact exposure apparatus equipped with an exposure source emitting UV radiation has to proceed through a film transparency as intermediate original made of the paper paste-up composition.

Indeed, the paper of a paste-up composition is too less transparent to ultra-violet light and does not enable contact exposure in transmission in conjunction with the above defined UV-sensitive presensitized plates.

In another method for the production of lithographic printing plates, wherein no wash-off processing is needed, a silver complex diffusion transfer reversal process is used according to which a positive oleophilic silver image on a hydrophilic or hydrophilizable substrate, e.g. aluminium foil serving as image-receiving material is produced. The production of a lithographic also called planographic printing plate by DTR-processing is described in detail by André Rott and Edith Weyde in the book "Photographic Silver Halide Diffusion Processes"—Focal Press—London—New York, (1972), pp. 101–105.

In the DTR-method a paper paste-up can be used directly as original since owing to the high sensitivity to visible light obtained by spectral sensitization the light-sensitive silver halide emulsion material can be exposed optically in a process camera or by reflex printing or transmission printing on a flat-bed printer using visible light emitting exposure sources.

However, the DTR-silver halide materials have poor exposure latitude which results in inferior imaging and printing results when the exposure proceeds by direct-contact exposure in transmission through a paper paste-up and have the disadvantage that they cannot be handled under ambient light conditions.

There is not only a need for high exposure latitude in order to level the differences in optical density background when in a paper paste-up paper pieces of different origin and optical transparency are used but also because the reproduction of fairly large image areas, e.g. an image area of 70 cm×80 cm, with a contact exposure apparatus operating with a single centrally positioned light source gives rise to light flux variations between the edges and the center of the exposure platen of about 20 percent.

The direct-contact exposure technique is well-known in the art of photography and is described and illustrated in Copying Methods Manual by William R. Hawken—Library Technology Program, Chicago, (1966), pp. 207–209. Good between the original and the photographic material is ensured in a contact exposure apparatus operating with a vacuum frame. By the contact exposure technique right reading as well as reverse reading copies can be obtained.

The production of light-sensitive negative working silver halide emulsion materials that can be handled before, during or after image-wise exposure and during processing for an extended period of time under ambient light conditions is described in Research Disclosure, March 1978, item 16735.

It is an object of the present invention to provide a photographic silver complex diffusion transfer reversal process being particularly suited for the production of a lithographic printing plate wherein use is made of a particular photographic silver halide emulsion material which material has large exposure latitude and sensitivity to visible light sufficient for contact exposure through paper paste up originals but also has poor room light sensitivity.

It is another object of the present invention to provide such a process wherein said silver halide emulsion material is exposed under the circumstances used for presensitized plates with an exposure source emitting ultra-violet light and some visible light.

Other objects and advantages of the present invention will become apparent from the further description.

In accordance with the present invention a method for the production of a photographic image by silver complex diffusion transfer processing comprises the steps of:

(1) providing a negative working silver halide emulsion material which can be handled under room light conditions without prohibitive fogging, said material having a low intensity reciprocity failure (L.I.R.F) obtained by the absence of intentional chemical sensitization and by the presence in combination with the silver halide of at least one electron accepting compound and being spectrally sensitized within the visible light spectrum in the wavelength range of 480 to 580 nm; the low intensity reciprocity failure of said material when graphically depicted in an orthogonal coordinate system having in the abscissa the logarithm of the irradiance (1) in lux and in the ordinate the logarithm of the product of the irradiance (1) with exposure time (t) in seconds is defined by a graph representing the product of a minimal exposure time with a certain irradiance being put against said irradiance, wherein said minimal exposure time is the shortest exposure time for the abscissa defined irradiance giving rise to a silver image density in the exposed and DTR-processed photographic material thus high that in corresponding area of a therewith DTR-processed image-receiving material no visible silver metal fog density is formed; the curvature of said graph being such that:

(1) the derivative of dlog I.t/dlog I has a value less than minus 0.5 at values of irradiance below 100 lux, and (2) the absolute value of the derivative of dlog I.t/dlog I is not higher than 0.2 at values of irradiance in the range of 500 lux to 5000 lux;

(2) contact-exposing said photographic material with visible light through a sheet support carrying paper paste-up material with its information facing the silver halide emulsion layer of the photographic material, and (3) developing the resulting latent image in the presence of a silver halide complexing agent and contacting the thus developed silver halide emulsion material with an image-receiving material to form thereon a silver image.

Preferably said derivative of dlog I.t/dlog I has a value less than minus 0.5 below 400 lux in said graph.

The contact exposure proceeds preferably under vacuum conditions in a therefor known contact exposure apparatus operating with a vacuum frame.

In the production of a planographic printing plate the image-receiving material is a substrate with hydrophilic or hydrophilizable surface, such as an aluminium sheet.

By "negative working silver halide emulsion material" is understood a material that by photo-exposure and development yields a silver image in correspondence with the photo-exposed area.

For the definition of "irradiance" and the phenomenon "low intensity reprocity failure" reference is made to the book "The Theory of the Photographic Process", 4th ed. by T. H. James—Macmillan Publishing Co., Inc. New York (1977) pp. 133.

The present invention is illustrated by accompanying drawings.

In FIG. 1 a curve of log I.t versus log I obtained in DTR-pr according to Example 1 is presented.

Figure 4:
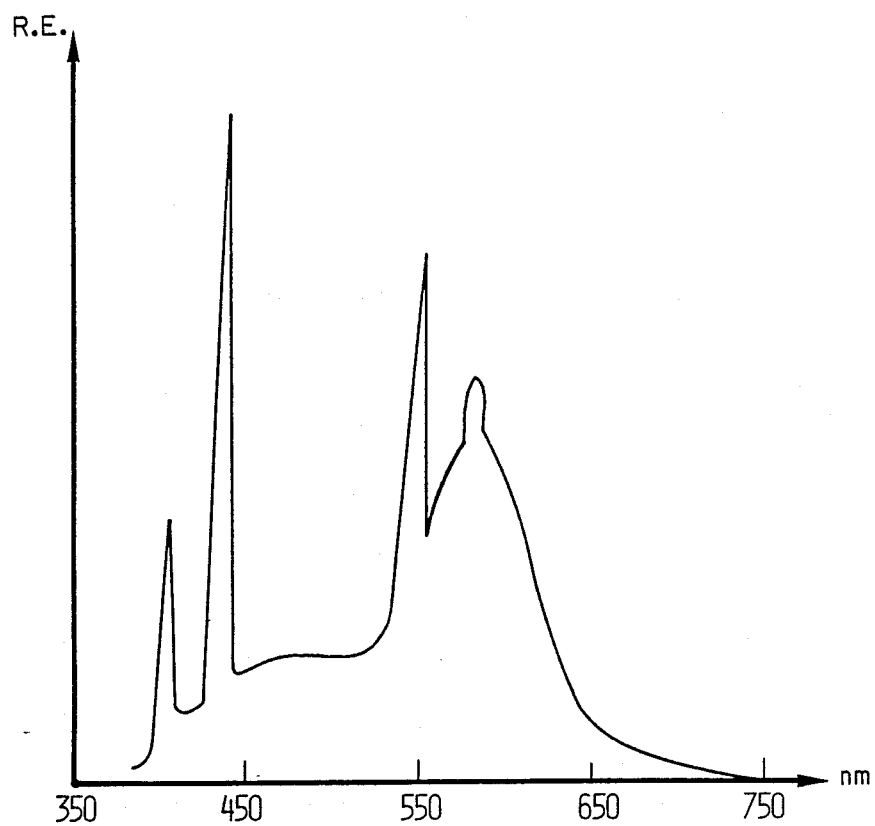
FIG. 4 represents the spectrum of a fluorescent lamp used in a room light sensitivity test with regard to the photographic material of Example 1.

Preferred negative working silver halide emulsion materials for use according to the present invention can be handled without substantial fogging under exposure conditions corresponding with an irradiance of 200 lux during 120 seconds with a fluorescent lamp having an emmission spectrum as illustrated in FIG. 4.

The above defined L.I.R.F. characteristics of the photographic material according to the present invention are obtained by the omission of an intentional chemical sensitization in the preparation of silver halide grains and the presence at the surface of said grains of at least one electron accepting compound also called desensitizer. A survey of suitable desensitizers is given in Chapter XLII in the book Photographic Chemistry by Pierre Glafkidés, Vol. two, Fountain Press London, (1960), 920–934. For useful desensitizers reference is also made to the already mentioned Research Disclosure and the published EP-A No. 0 088 581.

A particularly userful desensitizing compound for the intended purpose is pinakryptol yellow which is preferably used in an amount by weight in the range of 0.1 to 10 g with respect to 100 g of silver nitrate equivalent with the applied silver halide.

The type of silver halide used in the negative working silver halide emulsion applied in the process of the present invention is preferably mainly (at least 50 mole %) silver chloride the balance, if any, being bromide and/or iodide.

The grain size of the silver halide is preferably in the range of 0.10 μm to 0.80 μm.

It has been found experimentally that spectrally sensitized silver halide enables the use of the commercial UV-radiation emitting sources applied in contact exposure of pre-sensitized printing plates, because these sources also emit partly in the visible spectrum, so that no additional investment has to be made on switching from presensitized plates to DTR-plates.

In order to obtain an improved spectral sensitivity with regard to light penetrating through the paper of a paper paste-up original the sensitivity spectrum of the silver halide is made to optimally match the light of a commonly applied contact-exposure source emitting together with UV radiation (see FIG. 3) in the visible spectrum range mainly in the 500 to 600 nm band (mainly green light).

Spectral sensitivity to light in the 500 to 600 nm range can be obtained with spectral sensitizing agents corresponding to one of the following structural formulae 1 to 6:

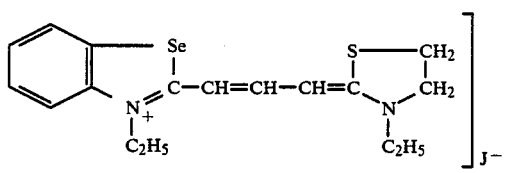

1.

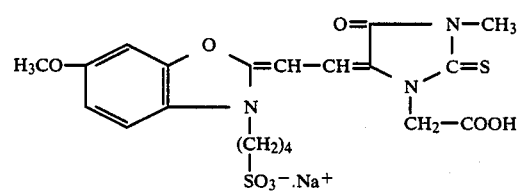

2.

-continued

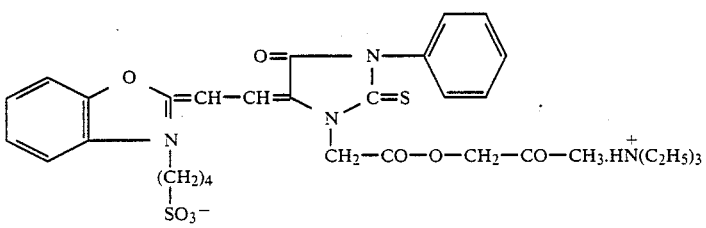

3.

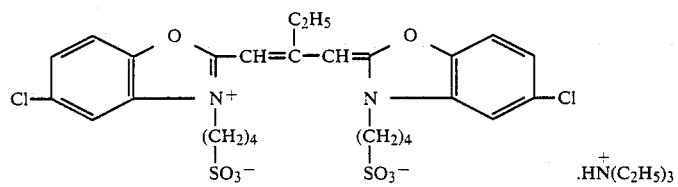

4.

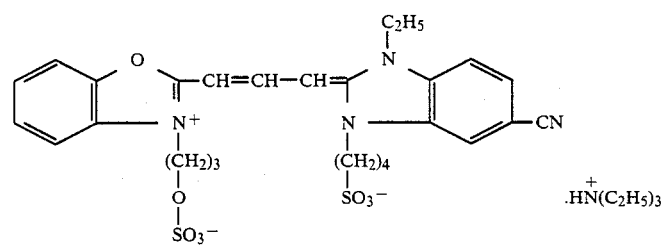

5.

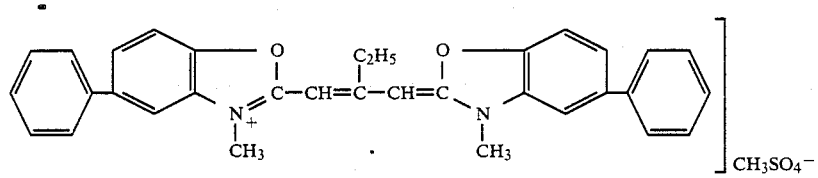

6.

It has been found further experimentally that the use in working contact with the electron accepting compound of a reducing agent is in favour of obtaining a photographic material having the defined L.I.R.F. characteristic. Said reducing agent is preferably a compound commonly used as silver halide developing agent. An example of a preferably used reducing agent is hydroquinone. The concentration wherein said reducing agent is used in the photographic material is insufficient to effect full development of the exposed silver halide and is preferably in the range of 0.02 mole to 0.5 mole with respect to one mole of silver halide.

The silver halide emulsion layers of the photographic materials used according to the present invention contain preferably gelatin as hydrophilic colloid binder.

The thickness of the dry silver halide emulsion is preferably in the range of 2 μm to 5 μm.

The silver halide emulsion may contain stabilizers, anti-fogging agents, developing agent(s) and light- or UV-radiation screening substances to improve image sharpness.

The silver halide emulsion layer may be hardened to prevent substantial transfer of hydrophilic colloid to the receiving material in DTR-processing.

The support of the photographic material used according to the present invention may be any material as long as it does not impair the desired photographic properties. Preferably a flexible paper or resin support is used, e.g. a paper support coated at one or both sides with an Alpha-olefin polymer, e.g. polyethylene or a resin film support made of e.g. cellulose triacetate. organic polycarbonate. or polyester such as polyethylene terephthalate.

In order to improve the resolving power and image sharpness the photographic material preferably contains an anti-halation coating also called anti-reflection coating absorbing light used in the exposure.

The anti-halation coating in light-sensitive materials for DTR-processing has not to be removed in the processing stage since the photographic material does not serve as the final print to be inspected.

According to a preferred embodiment an anti-halation coating on the basis of carbon black or a combination of carbon black and titanium dioxide in a binder is applied between the silver halide emulsion layer and its support. The optical density of such anti-halation layer is preferably in the range of 0.5 to 4.0. Such layer has not only anti-reflection properties with respect to visible light but also absorbs effectively ultra-violet radiation.

A particularly suitable anti-halation layer system comprising a non-bleachable black anti-halation layer in combination with a white light reflecting layer comprising a white pigment such as titanium dioxide is described in U.S. Pat. No. 4,224,402.

The negative w s halide emulsion material used in the present DTR-processing may be combined with any image-receiving material known in the art, but for lithographic printing plate reproduction preferably an aluminium plate is used. Suited aluminium plates being anodized and h sealed are described e.g. in U.S. Pat. No. 4,425,420 and European Pat. No. 0 059 008. The aluminium plate provided with development nuclei, e.g. as described in DE-OS No. 27 07 428 or may be free therefrom whereby the aluminum metal in alkaline medium plays an active role in the reduction of the transferred silver complex compounds.

The development and DTR-processing as is known in the art proceeds with an alkaline aqueous liquid containing silver halide developing agent(s) in the presence of a silver complexing agent, preferably thiosulphate ions.

The development and transfer process for the production of an aluminium offset plate preferably proceeds in an automatically operated apparatus, e.g. COPYRAPID CR 740 (registered trade mark). The processing is normally carried out in the temperature range of 18° to 38° C.

After formation of the silver image on the aluminium the surface thereof is subjected as is common practice in the art to a chemical treatment, commonly called lithographic fixer treatment which increases the hydrophility of the non-silver parts and increases the oleophility or oleophilic ink acceptance in the silver image parts.

Suitable ingredients for use in a fixing liquid improving the ink-affinity belong e.g. to the class of organic compounds having a mercapto group, e.g. dodecyl mercaptan and 1-phenyl-IH-tetrazole-thione and the hydrophobizing compounds described in U.S. Pat. No. 4,563,410.

Compounds improving the hydrophility and oleophilic ink-repellency of bare anodized aluminium plates are phosphoric acid and polysaccharides such as gum arabic and sorbitol.

For producing long-run plates the silver image areas are covered with a lacquer, e.g. on the basis of phenol- or cresol-formaldehyde resin, alkyd resin and/or epoxide resin. A lithographic fixer composition wherein the fixer and lacquer are combined is described in GB-P No. 969,072.

In another application of the DTR-process according to the present invention silver image formation proceeds on a transparent image-receiving material coated with a development nuclei containing layer. The silver image obtained thereon can be used as a mask for the exposure of photohardenable materials to form a photoresist. An example of the application of such photoresist s in the production of silk screen printing forms.

The following example illustrates the present invention, without however limiting it thereto. All ratios and percentages are by weight unless otherwise indicated.

EXAMPLE

Manufacture of the photographic material

In a period of 3 minutes an aqueous solution containing 0.059 mole of potassium bromide and 3.17 mole of sodium chloride and an aqueous solution of 2.94 mole of silver nitrate were pured simultaneously at 30° C. into an aqueous solution containing 3% of gelatin. brought at a pH 3 w sulphuric acid. After physical ripening for 3 minutes the emulsion was admixed with polystyrene sulphonic acid and the precipitate formed was washed with demineralized water. Gelatin was added to the washed emulsion to bring the gelatin content to 115 g per 1000 g of silver halide emulsion which contained an amount of silver nitrate equivalent with 165 g of silver nitrate per 1000 g.

To 100 9 of this emulsion were added subsequently, and in the following order: 20 ml of an aqueous solution of pinacryptol yellow (2.5 g/l) and a solution containing 0.0126 mmole of a spectral sensitizer corresponding to the structural formula 1 mentioned hereinbefore.

Further were added a gelatin plasticizer, common stabilizing agents and the usual coating aids, as well as a solution of 1.36 mmole of potassium bromide to adjust the pAg to about 8 and 17 mmole of hydroquinone.

The silver halide emulsion was coated on a paper support with anti-halation coating at a coverage of silver halide corresponding with an equivalent amount of 2.4 g of silver nitrate per m2.

Figure 2:
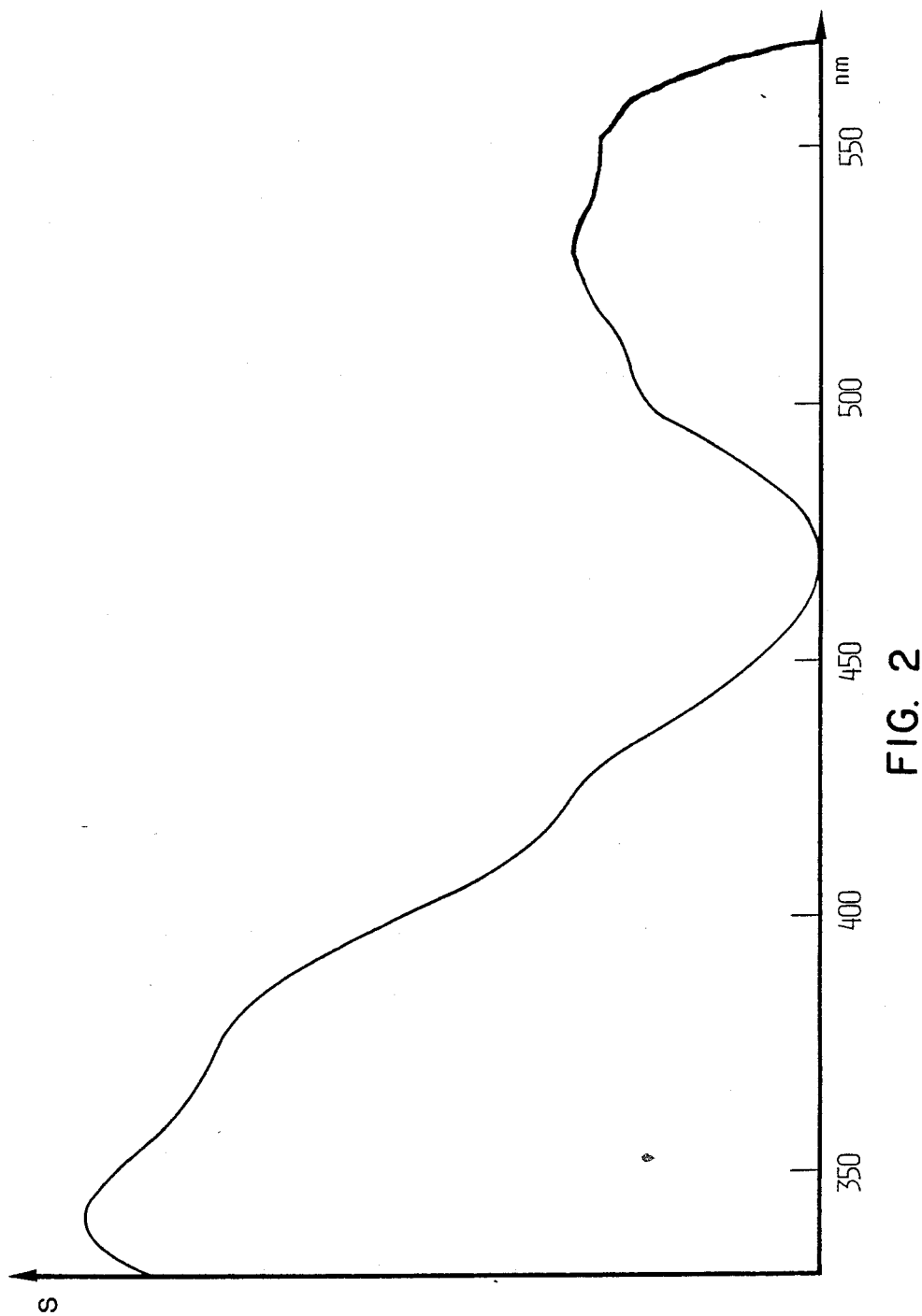
FIG. 2 represents a curve wherein spectral sensitivity (S) expressed in relative values is plotted as a function of wavelength in nm of the negative working silver halide emulsion material used in Example 1.

The spectral sensitivity of the obtained photographic material, relative speed (S) versus wavelength in nm is given FIG. 2.

The obtained photographic material can be handled without substantial fogging under exposure conditions corresponding with an irradiance of 200 lux during 120 seconds with a fluorescent lamp the emmission spectrum of which has been given in FIG. 4. The development conditions for assessing said absence of fog are as defined hereinafter in the DTR-processing.

Test exposure procedures the L.I.R.F. properties of the photographic material Sheets of the same photographic material as described above exposed in direct contact each with a different paper paste-up original on a transparent polyester resin base having the silver halide emulsion in direct contact with the paper paste-up. The paper used in the paste-ups has inherently a transmission density to visible light of 0.6. Each paper paste-up has a different transmission density (D) resulting from a different silver metal coverage obtained by proper exposure and development of a silver halide emulsion layer on paper base for paper paste-up. A first paste-up has a silver metal transmission density 0.1 above the transmission density of the paper (0.6) and the other paste-up originals have higher transmission densities, the increment ($\Delta D$) from paste-up to paste-up being 0.1, and the paste-up with the hignest transmission density having a silver metal density of 2.0.

Figure 3:
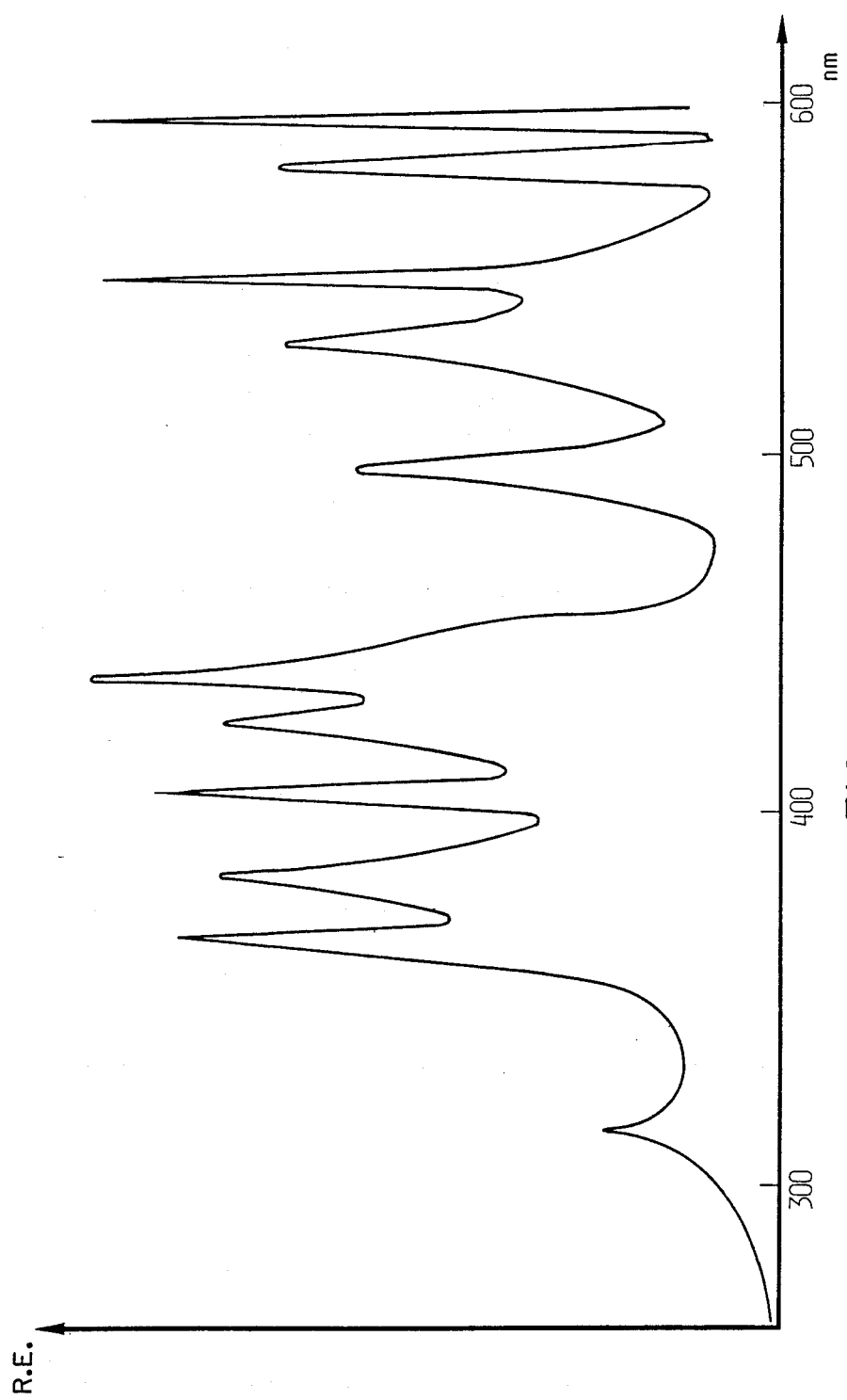
FIG. 3 represents the emission spectrum (relative emission strength (R.E.) percentagewise versus wavelength in nml of the exposure source used in Example 1.

The exposure through each paste-up proceeded in a vacuum frame of the contact exposure apparatus CDL 1000 S (trade name of Agfa-Gevaert N.V. Belgium) equipped with an UV radiation emitting source also emitting in the visible light range as illustrated in FIG. 3 wherein relative emission strength (R.E.) is given versus wavelength in nm.

In order to have a check on the L.I.R.F. of the photographic material a first series of sheets of the same photographic material was exposed through a paper paste-up of same optical transmission density the exposure time for each sheet being different and going from 10 seconds to 1000 seconds. Up to an exposure time of 100 exposure increments of 10 s were used and from thereon to 1000 s increments of 100 s were used.

The thus exposed photographic materials were DTR-processed with a commercial roughened anodized aluminium sheet image-receiving material COPYRAPID CRAA (trade name of Agfa-Gevaert N.V.—Belgium) using a processing liquid as described hereinafter. The minimal exposure time (s) was noted at which in the image-receiving material no silver deposit took place.

Said procedure was repeated with other series of the same photographic sheets using each time a paper paste-up original having a higher optical transmission density as defined going with an increment of 0.1 up to 2.0 above the paper density of 0.6. The higher density paste-up originals correspond with lower log I values in the exposure.

Figure 1:
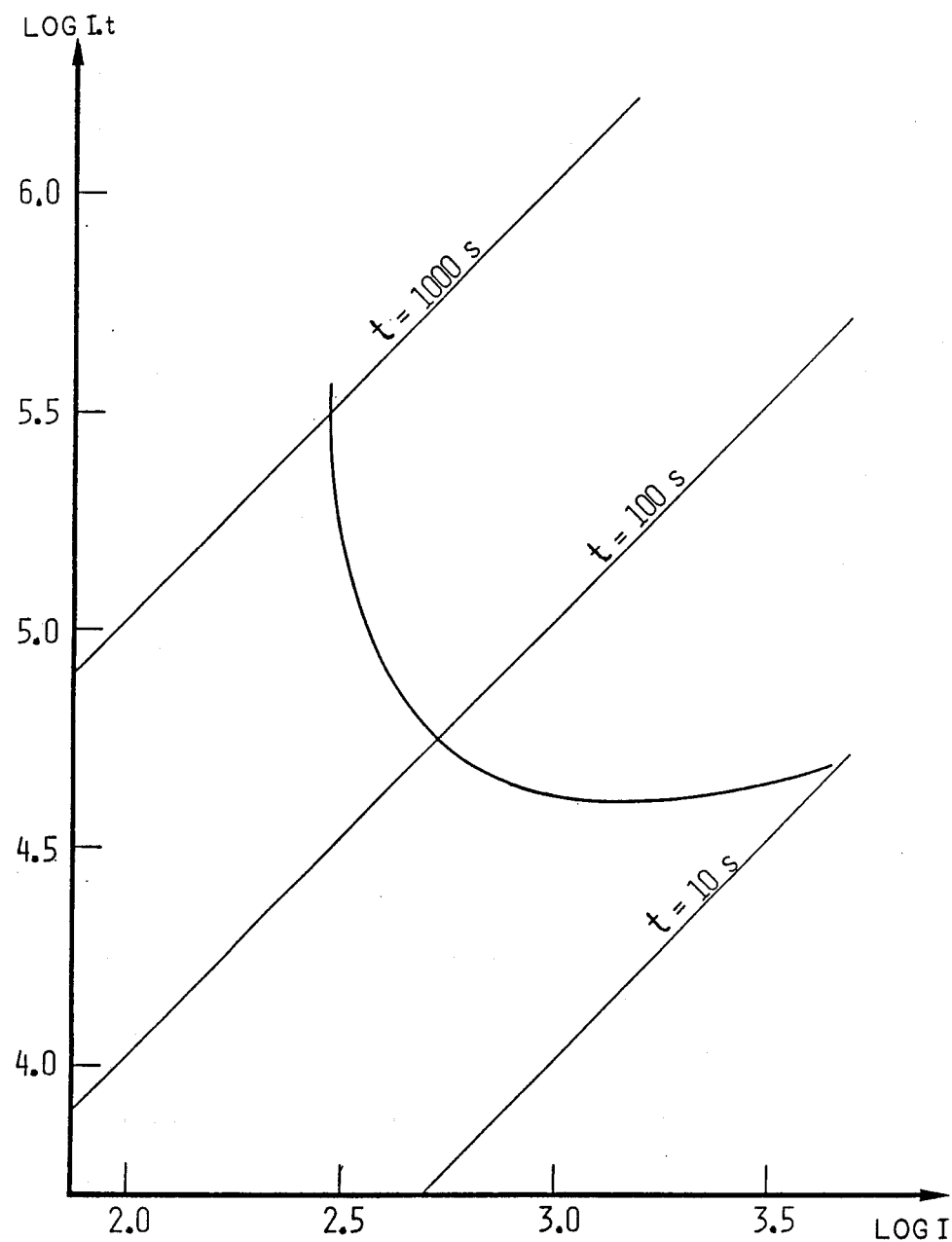

In the accompanying FIG. 1 the represented curve is obtained by plotting the log I values versus the log I.t values wherein t is the minimal exposure time in seconds giving rise in the photographic material to a silver image density thus high that in said commercial image-receiving material COPYRAPID CRAA (trade name of Agfa-Gevaert N.V.—Belgium) no visible silver metal density by diffusion transfer processing as described hereinafter is obtained. The said minimal exposure time is on applying the defined exposure series in combination with the paper paste-up originals of different optical transmission density determined in combination with irradiance values going from 50 to 5000 lux.

The logarithms of irradiance (I) correspond with lux values according to the following equation: $n\ lux = 10^I$. So, 100 lux corresponds with a log I value 2, 400 lux a log I value 2.60, 500 lux corresponds with a log I value 2.69 and 5000 lux corresponds with a log I value 3.69. Lower log I values correspond with higher density areas of the paper paste-up.

From the obtained graph can be learned that at irradiance values I lower than 500 lux, i.e. log I lower than 2.69, a very strong increase of the minimal exposure time is needed to built up a silver density in the image receiving material. Such property is at the basis of the large exposure latitude so much desired when applying contact exposure of paper paste-up originals.

Diffusion transfer reversal (DTR-) processing

Each exposed photographic material was dipped at 24° C. in a solution containing the following ingredients:

| | |
|---|---|
| sodium hydroxide | 22.5 g |
| carboxymethylcellulose | 18.0 g |
| sodium sulphite (anhydrous) | 120 g |
| hydroquinone | 20 g |
| 1-phenyl-4-methyl-pyrazolidin-3-one | 3.25 g |
| potassium bromide | 0.75 g |
| sodium thiosulphate | 8 g |
| water up to | 1000 ml |

Immediately after dipping the moistened photographic material was kept in contact for 30 s with the aluminium sheet image receiving material serving in the production of prints made by lithographic printing.

We claim:

1. A method for the production of a photographic image by silver complex diffusion transfer processing comprising the steps of:
    (1) providing a negative working silver halide emulsion material which can be handled under room light conditions without prohibitive fogging, said material having a low intensity reciprocity failure (L.I.R.F) obtained by the absence of intentional chemical sensitization and by the presence in combination with the silver halide of at least one electron accepting compound, and being spectrally sensitized within the visible light spectrum in the wavelength range of 480 to 580 nm; the low intensity reciprocity failure of said material when graphically depicted in an orthogonal coordinate system having in the abscissa the logarithm of the irradiance (I) in lux and in the ordinate the logarithm of the product of the irradiance (I) with exposure time (t) in seconds is defined by a graph representing the product of a minimal exposure time with a certain irradiance being put against said irradiance. wherein said minimal exposure time is the shortest exposure time for the in the abscissa defined irradiance giving rise to a silver image density in the exposed and DTR-processed photographic material thus high that in corresponding area of a therewith DTR-processed image-receiving material no visible silver metal fog density is formed; the curvature of said graph being such that:
        (1) the derivative of dlog I.t/dlog I has a value less than minus 0.5 at values of irradiance below 100 lux, and
        (2) the absolute value of the derivative of dlog I.t/dlog I is not higher than 0.2 at values of irradiance in the range of 500 lux to 5000 lux;
    (2) contact-exposing said photographic material with visible light through a sheet support carrying paper paste-up material with its information facing the silver halide emulsion layer of the photographic material, and
    (3) developing the resulting latent image in the presence of a silver halide complexing agent and contacting the thus developed silver halide emulsion material with an image-receiving material to form thereon a silver image.

2. A method according to claim 1, wherein the image-receiving material is an aluminium sheet which after silver image formation thereon is used as planographic printing plate.

3. A method according to claim 1, wherein the exposure proceeds in a contact exposure apparatus provided with an exposure light source emitting ultra-violet radiation and some visible light as is used in the exposure of presensitized plates.

4. A method according to claim 1, wherein the negative working silver halide emulsion material can be handled without substantial fogging under exposure conditions corresponding with an irradiance of 200 lux during 120 seconds with a fluorescent lamp having an emmission spectrum as illustrated in FIG. 4.

5. A method according to claim 1, wherein the electron-accepting compound is pinakryptol yellow being used in an amount by weight in the range of 0.1 to 10 g with respect to 100 g of silver nitrate equivalent with the applied silver halide.

6. A method according to claim 1, wherein the type of silver halide used in the negative working silver halide emulsion is mainly silver chloride.

7. A method according to claim 1, wherein the silver halide is spectrally sensitized with a sensitizing dye corresponding to one of the following structural formulae 1 to 6:

1. 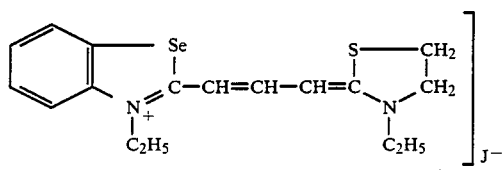

2. 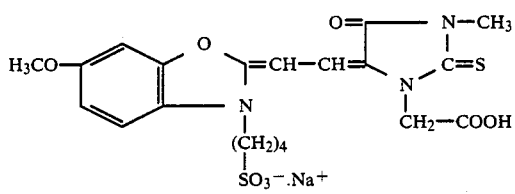

3. 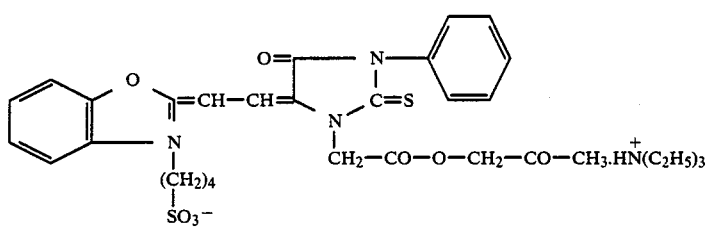

4. 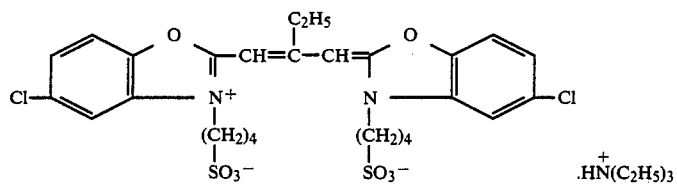

5. 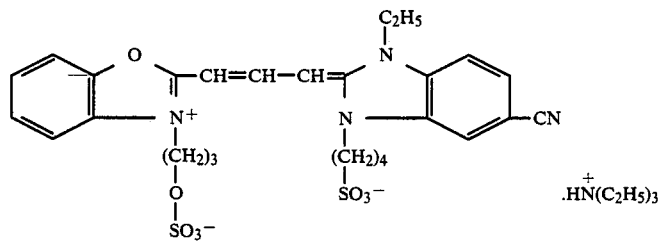

6. 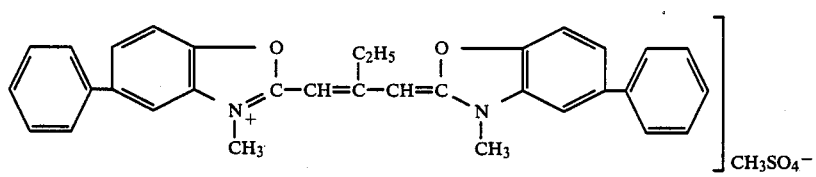

8. A method according to claim 1, wherein the material comprises in working contact with the electron accepting compound a reducing agent.

9. A method according to claim 8, wherein said reducing agent is a compound commonly used as silver halide developing agent in a silver halide photographic material but is used in said material in an amount insufficient to effect full development of the exposed silver halide.

10. A method according to claim 9, wherein said reducing agent is hydroquinone.

* * * * *